US012695180B2

(12) United States Patent
Fu et al.

(10) Patent No.: US 12,695,180 B2
(45) Date of Patent: Jul. 28, 2026

(54) CIRCUIT BOARD AND MANUFACTURING METHOD THEREOF

(71) Applicants: HongQiSheng Precision Electronics (QinHuangDao) Co.,Ltd., Qinhuangdao (CN); Avary Holding (Shenzhen) Co., Limited., Shenzhen (CN); GARUDA TECHNOLOGY CO., LTD., New Taipei (TW)

(72) Inventors: Chih-Chieh Fu, New Taipei (TW); Yu-Jia Men, Qinhuangdao (CN)

(73) Assignees: HongQiSheng Precision Electronics (QinHuangDao) Co., Ltd., Qinhuangdao (CN); Avary Holding (Shenzhen) Co., Limited., Shenzhen (CN); GARUDA TECHNOLOGY CO., LTD., New Taipei (TW)

( * ) Notice: Subject to any disclaimer, the term of this patent is extended or adjusted under 35 U.S.C. 154(b) by 39 days.

(21) Appl. No.: 18/036,372

(22) PCT Filed: Oct. 18, 2021

(86) PCT No.: PCT/CN2021/124407
§ 371 (c)(1),
(2) Date: May 10, 2023

(87) PCT Pub. No.: WO2023/065068
PCT Pub. Date: Apr. 27, 2023

(65) Prior Publication Data
US 2024/0006748 A1 Jan. 4, 2024

(51) Int. Cl.
*H05K 1/02* (2006.01)
*H01Q 1/38* (2006.01)
*H01Q 9/04* (2006.01)

(52) U.S. Cl.
CPC ............. *H01Q 1/38* (2013.01); *H05K 1/0237* (2013.01); *H05K 1/0298* (2013.01); *H01Q 9/0407* (2013.01); *H05K 2201/10098* (2013.01)

(58) Field of Classification Search
CPC ...... H01Q 1/38; H01Q 13/106; H05K 1/0237; H05K 3/429; H05K 2201/10098;
(Continued)

(56) References Cited

U.S. PATENT DOCUMENTS 7,046,969 B2    5/2006    Ito et al.
10,271,428 B2   4/2019    Hosoda et al.
(Continued)

FOREIGN PATENT DOCUMENTS

CN          1398050 A     2/2003
CN          105451471 A   3/2016
(Continued)

OTHER PUBLICATIONS

English Translation EP3793023; IMST GmbH; Dr. Marta Martinez Vazquez; Published Mar. 17, 2021 (Year: 2021).*

*Primary Examiner* — Steven T Sawyer
(74) *Attorney, Agent, or Firm* — ScienBiziP, P.C.

(57) ABSTRACT

The present application provides a circuit board and a manufacturing method thereof. The manufacturing method includes: providing a stacked board; the stacked board includes a third conducting circuit, a second substrate, a first conducting circuit, a first substrate, and a second conducting circuit, which are stacked disposed in that order; defining several through holes on a surface of the stacked board along a stacked direction of the stacked board; and manufacturing antenna conductors in the through holes. The antenna conductors are disposed in the through holes on a surface of the stacked board, the antenna conductors on different layers are (Continued)

100 connected to corresponding conducting circuits, some of the antenna conductors are directly connected with the conducting circuit. A loss of signals while transmitting is reduced, and the circuit board including the antenna structure is changed from an up-down structure into a left-right structure for reducing a board thickness.

4 Claims, 8 Drawing Sheets

(58) Field of Classification Search
CPC ............ H05K 1/165; H05K 3/42; H05K 3/46; H05K 1/0298
See application file for complete search history.

(56) References Cited

U.S. PATENT DOCUMENTS

| | | | | |
|---|---|---|---|---|
| 10,566,686 | B2 | 2/2020 | Kaeding et al. | |
| 2013/0141885 | A1* | 6/2013 | Gu ........................... | H01Q 1/38 |
| | | | | 427/596 |
| 2018/0248254 | A1 | 8/2018 | Islam et al. | |
| 2020/0006853 | A1* | 1/2020 | Park ..................... | H01Q 9/0414 |

FOREIGN PATENT DOCUMENTS

| | | | |
|---|---|---|---|
| CN | 107516764 | A | 12/2017 |
| CN | 110660782 | A | 1/2020 |
| CN | 110957574 | A | 4/2020 |
| CN | 112448152 | A | 3/2021 |
| EP | 3793023 | A1 | 3/2021 |
| TW | 201731675 | A | 9/2017 |

* cited by examiner

20

21

11

22

101

121

11

122

CIRCUIT BOARD AND MANUFACTURING METHOD THEREOF

TECHNICAL FIELD

The present disclosure is related to printed circuit board technology field, particularly to a circuit board and manufacturing method thereof.

BACKGROUND

A printed circuit board (PCB) including an antenna structure often uses a up and down structure, the antenna structure is disposed on a side of the PCB. Under this condition, antenna conductors may only conduct with each other through blind holes, which may cause the signals to generate a larger loss. And due to the up-down structure, the PCB including the antenna structure often has a larger board thickness.

SUMMARY OF THE DISCLOSURE

The present application provides a circuit board and a manufacturing method thereof, which solves or relieve one or more technology problem in the related art, being capable of reducing a signal loss of the antenna on the PCB and decreasing a board thickness of the PCB including the antenna structure.

In a first aspect of the present disclosure, a manufacturing method of a board circuit is provided. The manufacturing method includes: providing a stacked board; the stacked board includes a third conducting circuit, a second substrate, a first conducting circuit, a first substrate, and a second conducting circuit, which are stacked disposed in that order; defining several through holes on a surface of the stacked board along a stacked direction of the stacked board; and manufacturing antenna conductors in the through holes.

Optionally, the step of defining several through holes on a surface of the stacked board along a stacked direction includes: defining a first through hole, a second through hole, and a third through hole on a surface of the stacked board along a stacked direction; all of the first through hole, the second through hole, and the third through hole are through the stacked board; the step of manufacturing antenna conductors in the through holes includes: manufacturing a first antenna conductor in the first through hole, manufacturing a second antenna conductor in the second through hole, and manufacturing a third antenna conductor in the third through hole; the first antenna conductor is connected with the first conducting circuit and the third conducting circuit; the second antenna conductor is connected with the first conducting circuit and the third conducting circuit; the third antenna conductor is connected with the first conducting circuit and the second conducting circuit.

Optionally, the step of providing a stacked board; the stacked board includes a third conducting circuit, a second substrate, a first conducting circuit, a first substrate, and a second conducting circuit, which are stacked disposed in that order includes: providing a double sided board; the double sided board includes the first substrate, the first conducting circuit and the second conducting circuit, which are formed on opposite surfaces of the first substrate; forming a second substrate and a third conductive material layer on a surface of the double sided board by pressing; the second substrate includes a first surface; the first surface is disposed on a side of the second substrate away from the first substrate, the third conductive material layer is disposed on the first surface; and etching the third conductive material layer to obtain the third conducting circuit.

Optionally, the step of manufacturing antenna conductors in the through holes includes: defining slots on sidewalls in the through holes; chemically depositing copper the slots; and manufacturing the antenna conductors in the slots.

Optionally, the step of manufacturing the antenna conductors in the slots includes: electroplating a layer of copper in the slots and on sidewalls of the through holes, and drilling holes in the slots to remove excess copper on the sidewalls of the through holes and retaining the copper in the slots as the antenna conductors.

In a second aspect of the present disclosure, a circuit board is provided. The circuit board includes: a stacked board, the stacked board includes a third conducting circuit, a second substrate, a first conducting circuit, a first substrate, and a second conducting circuit, which are stacked disposed in that order; several through holes are defined on the stacked board along a stacked direction of the stacked board; and antenna conductors disposed in the through holes.

Optionally, the through holes includes a first through hole, a second through hole, and a third through hole; the antenna conductors includes a first antenna conductor, a second antenna conductor, and a third antenna conductor; the first antenna conductor is disposed in the first through hole, two ends of which are connected with the first conducting circuit and the third conducting circuit; the second antenna conductor is disposed in the second through hole, two ends of which are connected with the first conducting circuit and the third conducting circuit; the third antenna conductor is disposed in the third through hole, two ends of which are connected with the first conducting circuit and the second conducting circuit.

Optionally, the stacked board includes: a first circuit layer, the first circuit layer includes a first substrate, a first conducting circuit, and a second conducting circuit; and a second circuit layer, the second circuit layer includes a second substrate and a third conducting circuit.

Optionally, the slots are defined in the through holes; the antenna conductors are disposed in the slots.

Optionally, a material of the antenna conductor is copper.

The present application includes at least advantageous effects as blew by comparing with the related art:

By defining through holes on a surface of the stacked board and disposing the antenna conductors in the through holes, the antenna conductors on different layers being connected to corresponding conducting circuits, some of the antenna conductors being directly connected with the conducting circuit, by comparing with the manner of blind hole connection, a loss of signals while transmitting is reduced. Meanwhile, the circuit board including the antenna structure is changed from an up-down structure into a left-right structure, and a board thickness is reduced.

Figure 1:
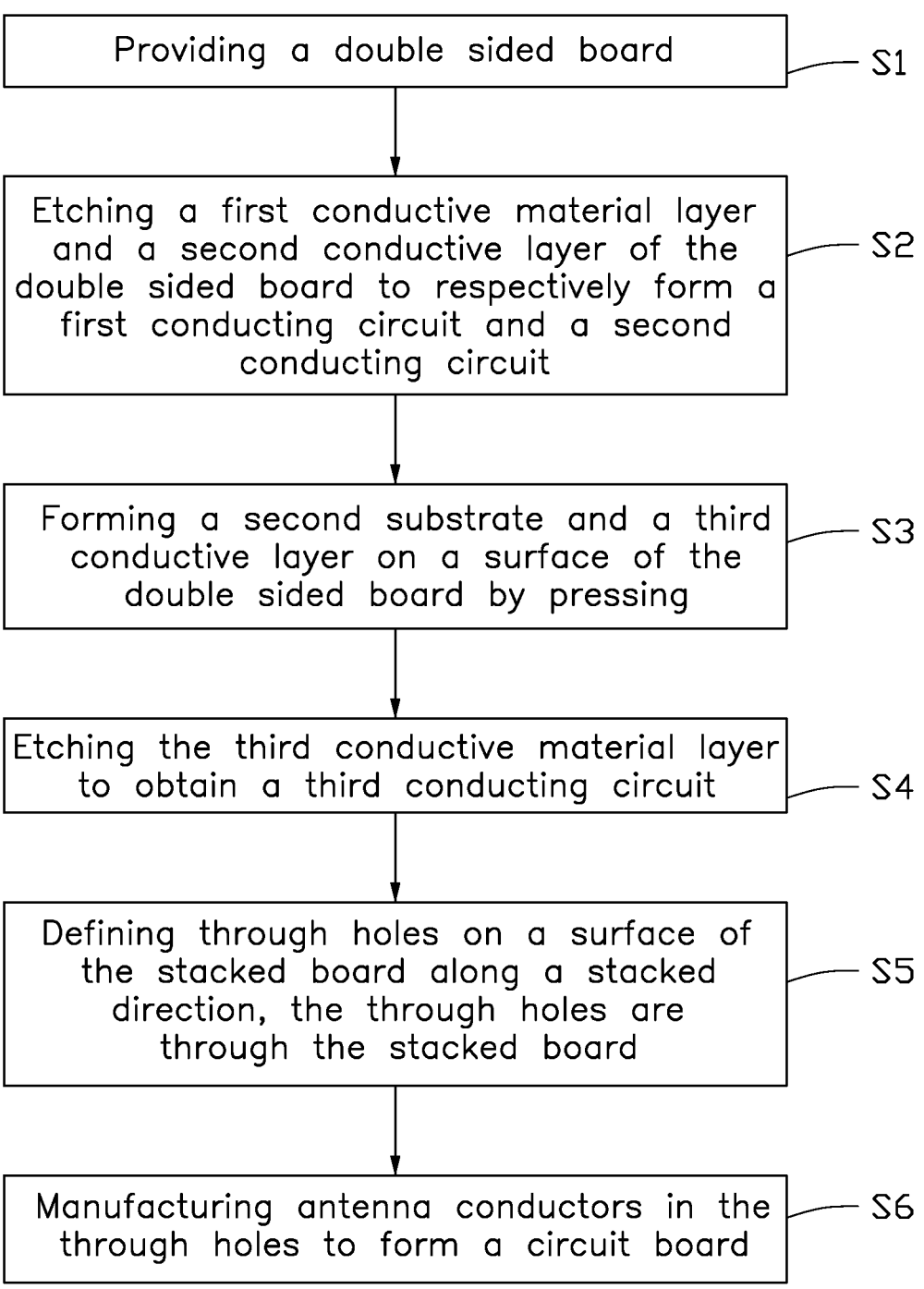
FIG. 1 is a flowchart illustrating an embodiment of a manufacturing method of a circuit board of the present application.

The following specific embodiments will further illustrate the present disclosure in conjunction with the above drawings.

NUMERIC OF MAIN COMPONENTS

Stacked board 10
Circuit board 100
First circuit layer 101
Second circuit layer 102
First substrate 11
First structure portion 110
Second substrate 12
Second structure portion 120
First conducting circuit 121
Second conducting circuit 122
Third conducting circuit 123
Conducting pole 13
Solder mask layer 14
Double board 20
First conductive material layer 21
Second conductive material layer 22
Third conductive material layer 23
First through hole 31
First slot 311
Second through hole 32
Second slot 321
Second through hole 33
Third slot 331
First antenna conductor 41
Second antenna conductor 42
Third antenna conductor 43

The following specific embodiments will further illustrate the present disclosure in conjunction with the above drawings.

DETAILED DESCRIPTION

In order to be able to more clearly understand the foregoing objectives, features, and advantages of the embodiments of the present application, the present application will be described in detail with reference to the accompanying drawings and specific embodiments as follows. It should be noted that the features in the embodiments of the present application are able to be combined with each other if there is no conflict. In the following description, many specific details are set forth in order to fully understand the embodiments of the present application. The described embodiments are part of the embodiments of the present application, not all of the embodiments.

Unless otherwise defined, all technical and scientific terms used herein have the same meaning as commonly understood by those skilled in the art belonging to the embodiments of the present application. The terms used in the description of the present application are only for describing specific embodiments, and are not intended to limit the present invention.

Referring to FIG. 1, a manufacturing method of a circuit board of the present application includes following steps:

In block S1, providing a double sided board.

Figure 2:
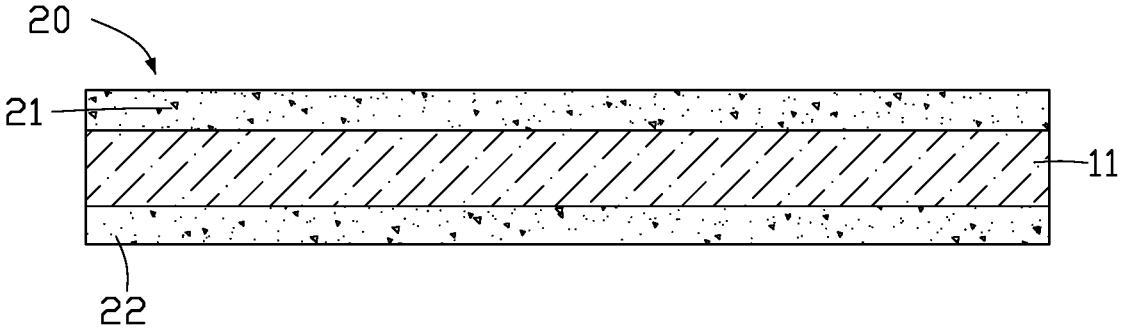
FIG. 2 is a schematic diagram illustrating an embodiment of a double sided board of the present application.

Referring to FIG. 2, the double sided board 20 provided in the present embodiment of the present application includes a first substrate 11 and a first conductive material layer 21 and a second conductive material layer 22, which are disposed on opposite surfaces of the first substrate 11.

In one embodiment, the double sided board 20 may be a double copper-clad substrate.

In block S2, etching the first conductive material layer 21 and the second conductive material layer 22 of the double sided board, to respectively form a first conducting circuit 121 and a second conducting circuit 122.

Figure 3:
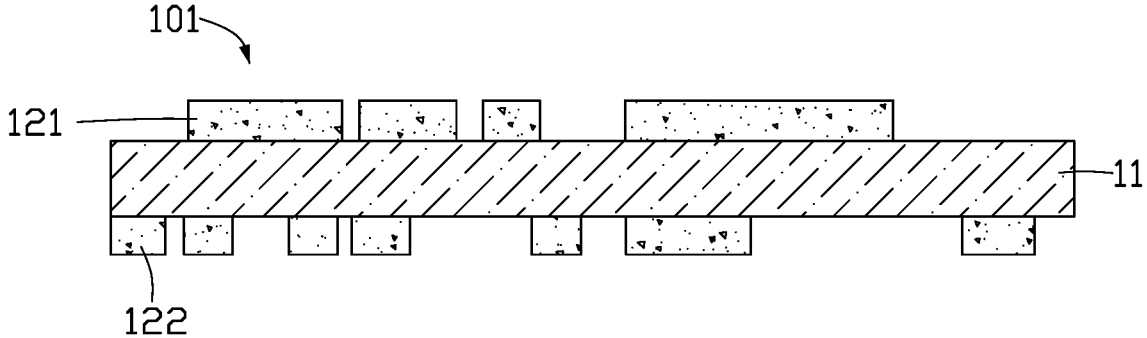
FIG. 3 is a schematic diagram illustrating an embodiment of forming a second conducting circuit and a third conducting circuit by etching the double sided board of the present application.

Referring to FIG. 3, after etching the double sided board 20, the double sided board after being etching process includes the first substrate 11 and the first conducting circuit 121 and the second conducting circuit 122 disposed on the opposite surfaces of the double sided board 20. Thus, the first substrate 11, the first conducting circuit 121, and the second conducting circuit 122 disposed on the opposite surfaces of the double sided board 20 form a first circuit layer 101.

In one embodiment, the first conductive material layer 21 and the second conductive material layer 22 disposed on the opposite surfaces of the first substrate 11 may be etched in a same etching process or be etched in different etching processes.

Figure 4:
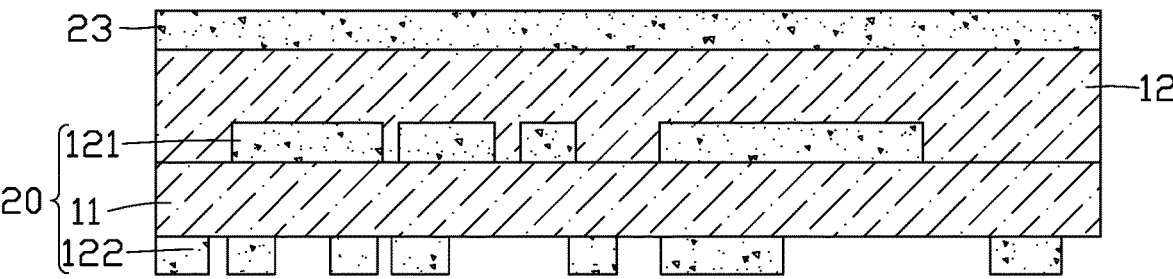
FIG. 4 is schematic diagram illustrating an embodiment of pressing on the double sided board of the present application.

In block S3, as shown in FIG. 4, forming a second substrate 12 and a third conductive material layer 23 on a surface of the first circuit layer 101 by pressing.

In one embodiment, the second substrate 12 includes a first surface 1201. The first surface 1201 is disposed on a side of the second substrate 12 away from the first substrate 11. The third conductive material layer 23 is pre-disposed on the first surface 1201.

It is understood that in a detail embodiment the block S3 may be place a surface without copper (without the third conductive material layer 23) of a single-sided copper-clad substrate (including the second substrate 12 and the third conductive material layer 23) facing down on a surface of the double sided board 20 with the first conducting circuit 121, and presses after alignment.

Figure 5:
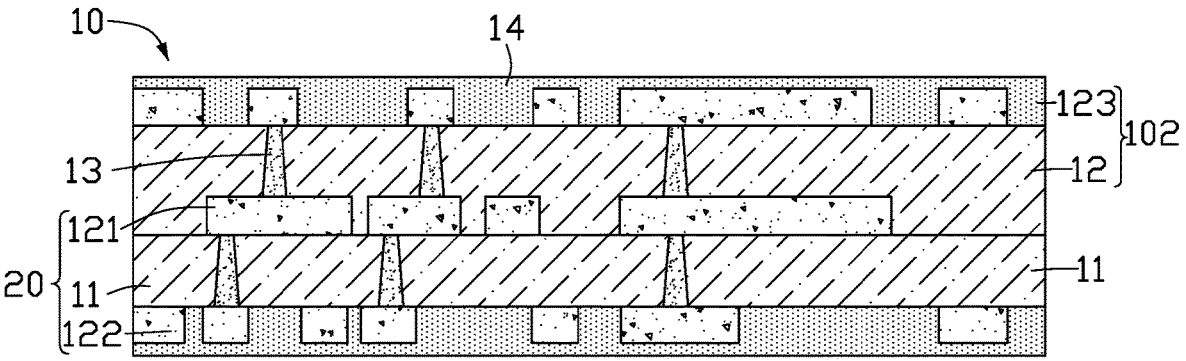
FIG. 5 is a schematic diagram illustrating an embodiment of forming a stacked board of the present application.

In block S4, as shown in FIG. 5, etching the third material layer 23 to obtain a third conducting circuit 123.

It is understood that the second substrate 12 and the third conducting circuit 123 form a second circuit layer 102. Thus, the first circuit 101 (referring to FIG. 3) and the second circuit 102 form the stacked board 10.

It is understood that, in some embodiments, the blocks S1-S4 may be omitted, directly providing a stacked board 10, the stacked board 10 includes the third conducting circuit 123, the second substrate 12, the first conducting circuit 121, the first substrate 11, and the second conducting circuit 122, which are stacked disposed in that order.

It is understood that, in one embodiment, the stacked board 10 is a three-layers circuit board (the first conducting circuit 121, the second conducting circuit 122, and the third conducting circuit 123). Certainly, in other embodiments, the stacked board 10 also may be more than three layers, the blocks S3 and S4 are repeated for several times. The stacked board 10 also may be two layers, the blocks S3 and S4 may be omitted.

Referring to FIG. 5, in another embodiment, the manufacturing method of the stacked board 10 also may include the following steps:

Forming several conducting poles 13.

It is understood that, in some embodiments, the conducting poles 13 may be formed between a partial of the first conducting circuit 121 and the second conducting circuit 122, or between the third conducting circuit 123 and the first conducting circuit 121. Thus, the first conducting circuit 121 is electrically connected with the second conducting circuit 122 through the conducting poles 13, the third conducting circuit 123 is also electrically connected with the first conducting circuit 121 through the conducting poles 13.

It is understood that, in another embodiment, the manufacturing method of the stacked board 10 also may include the following steps:

Forming a solder mask layer 14 on an outer side of the stacked board 10 (for example, the surface of the second conducting circuit 122 and the surface of the third conducting circuit 123) for protecting the stacked board 10 and preventing a physical disconnection of conducting circuit (such as the third conducting circuit 123). The solder mask layer 14 covers the substrate between the circuits (such as the second substrate 12 between the third conducting circuit 123) for preventing a short circuit between circuits generated by bridging connection. Meanwhile, the solder mask layer 14 covers all the conducting circuits without welding requirement, and also may prevent the copper layer from being oxidized.

In block S5, defining several through holes on a surface of the stacked board 10 along a stacked direction of the stacked board 10, the through holes are through the stacked board 10.

Figure 6:
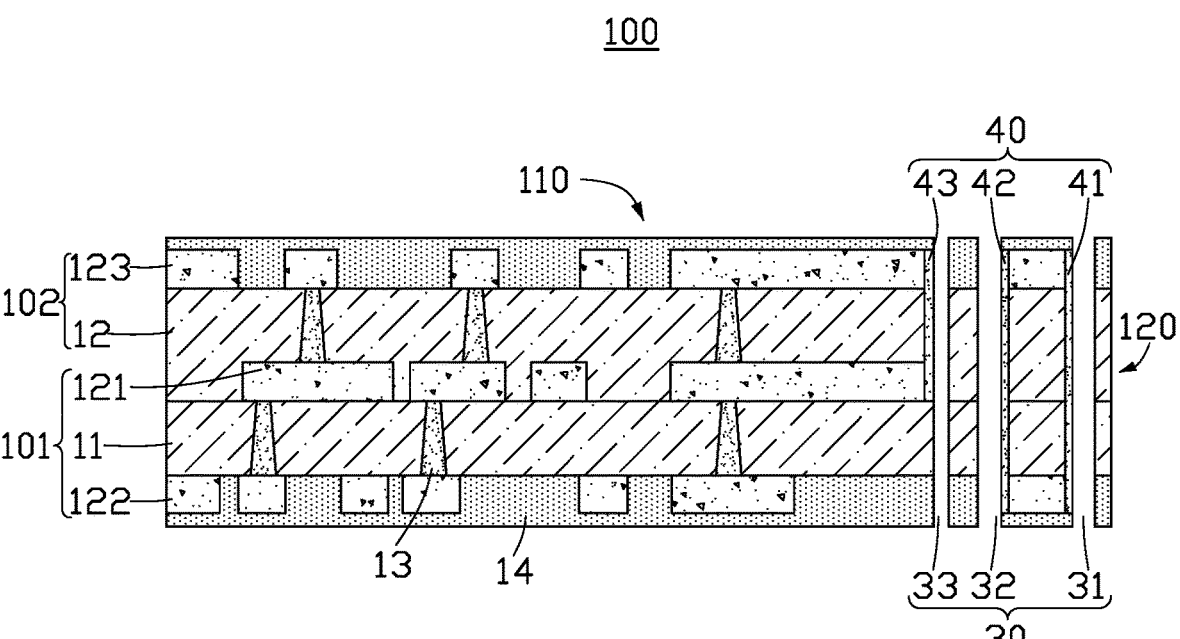
FIG. 6 is a schematic diagram illustrating an embodiment of defining through holes on the stacked board of the present application.

For example, as shown in FIG. 6, in one embodiment, the stacked board 10 includes three through holes, which are a first through hole 31, a second through hole 32, and a third through hole 33. It is understood that the surface of the stacked board 10 also may define a number of the through holes according to a detail requirement, but not being limited to three through holes of the embodiment (the first through hole 31, the second through hole 32, and the third through hole 33).

It is understood that, in one embodiment of the present application, all of the several through holes (the first through hole 31, the second through hole 32, and the third through hole 33) are through the stacked board 10 along a stacked direction of the first circuit layer 101 and the second circuit layer 102.

In block S6, referring to FIG. 6, manufacturing antenna conductor in the through holes to form the circuit board 100.

It is understood that, by defining the through holes in the stacked board 10, the stacked board 10 is divided into two portions in a left-right structure (a first structure portion 110 and a second structure portion 120), and the antenna conductors are formed in the through holes in the second structure portion 120, for making the circuit board 100 with antenna conductors to be a left-right structure and decreasing a board thickness.

It is understood that, in one embodiment, using manufacturing three antenna conductors in the three through holes as an example for describing. That is, manufacturing a first antenna conductor 41 in the first through hole 31, manufacturing a second antenna conductor 43 in the second through hole 32, and manufacturing a third antenna conductor 43 in the third through hole 33 as an example for describing.

It is understood that different antenna conductors are connected to a corresponding conducting circuit (for example the first conducting circuit 121, the second conducting circuit 122, and the third conducting circuit 123). In a detail embodiment, the first antenna conductor 41 is connected with the first conducting circuit 121 and the third conducting circuit 123, the second antenna conductor 42 is connected with the first conducting circuit 121 and the third conducting circuit 123, the third antenna conductor 43 is connected with the first conducting circuit 121 and the second conducting circuit 122.

Figure 7:
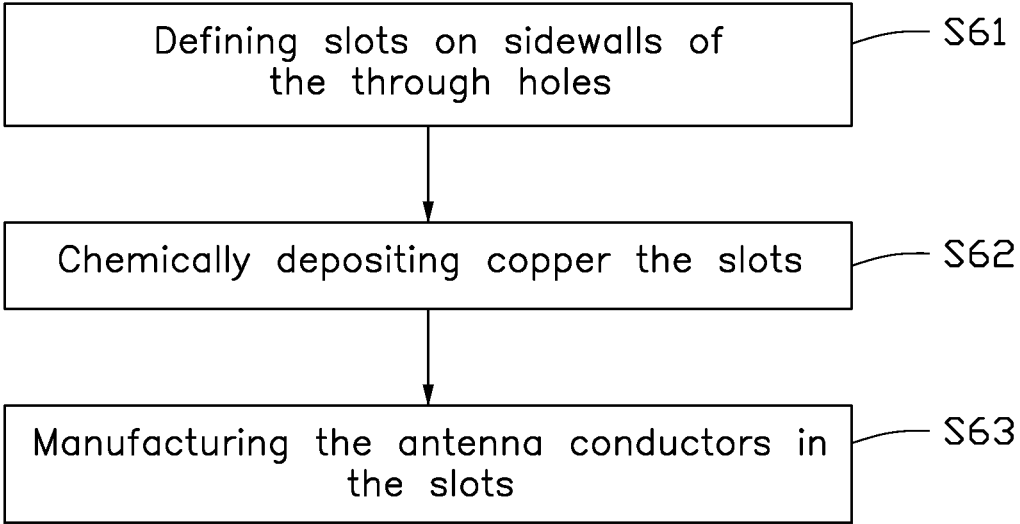
FIG. 7 is a flowchart of sub-steps of the step S6 in FIG. 1.
Figure 8:
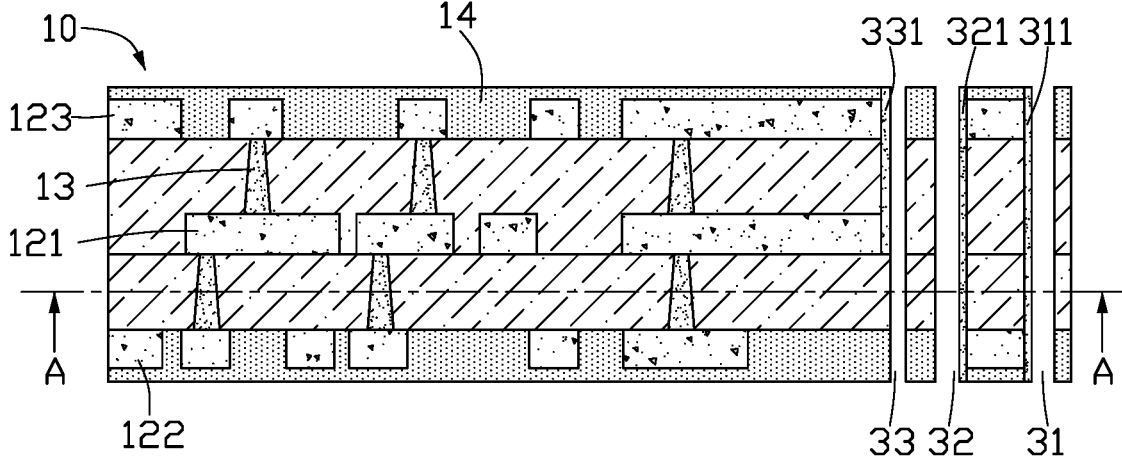
FIG. 8 is a schematic diagram illustrating an embodiment of defining slots in the through holes of the stacked board of the present application.

It is understood that the first antenna conductor 41 and the second antenna conductor 42 are connected through the first conducting circuit 121 and the third conducting circuit 123. By comparing with the circuit board 100 including the antenna structure in an up-down structure, connections using the blind holes are avoided, and a loss of the signals while transmitting is reduced. Referring to FIG. 7, it is a flowchart of sub-steps of the block S6. As shown in FIG. 7, the block S6 includes the following steps:

In block S61, as shown in FIG. 8, defining slots on a sidewall of the through holes.

In one detail embodiment, a first slot 311 is defined in the sidewall of the first through hole 31, a second slot 321 is defined in the sidewall of the second through hole 32, and a third slot 331 is defined in the sidewall of the third through hole 33.

The first slot 311 is defined along a defining direction of the first through hole 31 and is through two ends of the first through hole 31. The second slot 321 is defined along a defining direction of the second through hole 32 and is through two ends of the second through hole 32. The third slot 331 is defined along a defining direction of the third through hole 33. An end of the third slot 331 is exposed on the solder mask layer 14 or the first conducting circuit 121, and another end of the third slot 331 is extended to the second conducting circuit 122.

In this embodiment, the first slot 311, the second slot 321, and the third slot 331 may be one or more. For example, as shown in FIG. 9, in this embodiment, the first slot 311 includes three slots.

In block S62, chemically depositing cooper the slots.

In detail, the stacked board 10 with the slots is being chemically deposited copper, and a layer of chemical copper is deposited in the slots.

Figure 9:
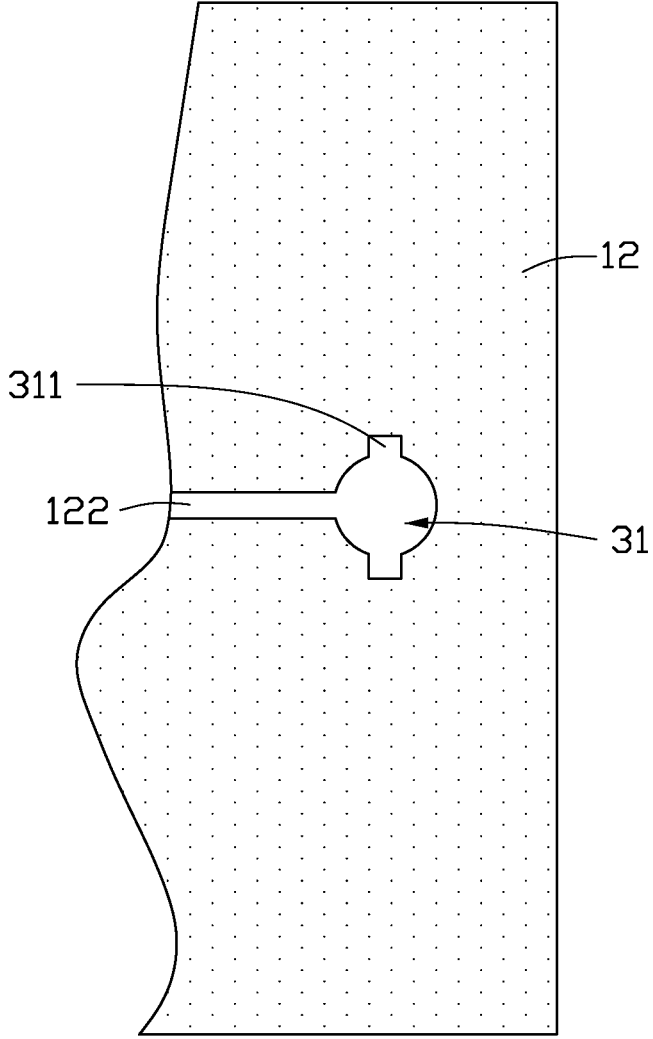
FIG. 9 is a cross-section diagram of FIG. 8, taken along a direction A-A.

In block S63, as shown in FIG. 9, manufacturing the antenna conductors 40 in the slots.

It is understood that, after chemically depositing copper in the slots, the stacked board 10 is being electroplated using electroplating solution (including conducting material) for electroplating the material of the antenna conductor on the deposited chemical copper in the slots, thus the manufacturing of the antenna conductor is achieved.

It is understood that the material of the first antenna conductor 41, the second antenna conductor 42, and the third antenna conductor 43 may be copper. Thus, in one embodiment, the block S63 detailly electroplates a layer of copper on sidewalls of the first through hole 31, the second through hole 32, and the third through hole 33 (including the first slot 311, the second slot 321, and the third slot 331). Holes are drilled in the first slot 311, the second slot 321, and the third slot 331, for removing excess copper on the sidewall of the first through hole 31, the second through hole 32, and the third through hole 33 and retaining the copper in the first slot 311, the second slot 321, and the third slot 331, the first antenna conductor 41, the second antenna conductor 42, and the third antenna conductor 43 are formed.

Referring to FIG. 6, a circuit board 100 provided by the present application includes a first circuit layer 101 and a second circuit layer 102.

The first circuit layer 101 includes a first substrate 11, a first conducting circuit 121, and a second conducting circuit 122 opposite to the first conducting circuit 121.

The second circuit 102 includes a second substrate 12 and a third conducting circuit 123. The second circuit layer 102 is disposed on a side of the first circuit layer 101 away from the first conducting circuit 121. The third conducting circuit 123 is disposed on a side of the second circuit 102 away from the first circuit layer 101.

The stacked board 10 defines several through holes, and antenna conductors are disposed in the through holes.

In one detail embodiment, the through holes include a first through hole 31, a second through hole 32, and a third through hole 33. The antenna conductors include a first antenna conductor 41, a second antenna conductor 42, and a third antenna conductor 43. The first antenna conductor 41 is disposed in the first through hole 31, two ends of the first antenna conductor 41 are connected with the first conducting circuit 121 and the third conducting circuit 123. The second antenna conductor is disposed in the second through hole 32, two ends of the second antenna conductor are connected with the first conducting circuit 121 and the third conducting circuit 123. The third antenna conductor 43 is disposed in the third through hole 33, two ends of the third antenna conductor 43 are connected with the first conducting circuit 121 and the second conducting circuit 122.

It is understood that the first through hole 31 defines a first slot 311 is defined in the, the second slot 32 defines a second slot 321, and the third through hole 33 defines a third slot 331 (as shown in FIG. 8).

It is understood that the material of the antenna conductor 40 is copper.

The present application defines through holes 30 on a surface of the stacked board 10, and the antenna conductors 40 are disposed in the through holes 30, the antenna conductor on different layers are connected with a corresponding conducting circuit (such as the first conducting circuit 121, the second conducting circuit 122, and the third conducting circuit 123), some of the antenna conductors are directly connected with the conducting circuit, by comparing with the manner of blind hole connection, a loss of signals while transmitting is reduced. Meanwhile, the circuit board 100 including the antenna structure is changed from an up-down structure into a left-right structure, and a board thickness is reduced.

Although the embodiments of the present disclosure have been shown and described, those having ordinary skill in the art can understand that changes may be made within the principles of the present disclosure, up to and including the full extent established by the broad general meaning of the terms used in the claims. It will, therefore, be appreciated that the embodiments described above may be modified within the scope of the claims.

What is claimed is:

1. A circuit board comprising:
a stacked board, the stacked board comprising a third conducting layer, a second substrate, a first conducting circuit, a first substrate, and a second conducting circuit, which are stacked disposed in that order; multiple through holes are defined on the stacked board along a stacked direction of the stacked board; a surface of the third conducting layer facing the second substrate is etched to form the third conducting circuit; and antenna conductors disposed in the multiple through holes respectively, and extended along a direction perpendicular to the stacked board;

wherein the antenna conductors comprises a first antenna conductor in one of the multiple through holes and a second antenna conductor in another of the multiple through holes; an end of the first antenna conductor and an end of the second antenna conductor are adjacent to the first conducting circuit, and are electrically connected with each other through the first conducting circuit; another end of the first antenna conductor and another end of the second antenna conductor are adjacent to the second conducting circuit, and are electrically connected with each other through the second conducting circuit;

wherein the multiple through holes comprises a first through hole, a second through hole, and a third through hole; the antenna conductors further comprises a third antenna conductor, wherein the first antenna conductor is disposed in the first through hole, the end and the other end of the first antenna conductor are directly connected with the first conducting circuit and the third conducting circuit, respectively; portions between the end and the other of the first antenna conductor are completely covered by the first substrate and the second substrate, respectively;

the second antenna conductor is disposed in the second through hole, the end and the other end of the second antenna conductor are directly connected with the first conducting circuit and the third conducting circuit, respectively; portions between the end and the other end of the second antenna conductor are completely covered by the first substrate and the second substrate, respectively; and the third antenna conductor is disposed in the third through hole, two ends of the third antenna conductor are directly connected with the first conducting circuit and the second conducting circuit, respectively; portions between the two ends of the third antenna conductor are completely covered by the second substrate.

2. The circuit board of claim 1, wherein
the first substrate, the first conducting circuit, and the second conducting circuit are stacked on opposite surfaces of the first substrate to form a first circuit layer; and the third conducting circuit is stacked on a surface of the second substrate facing the first substrate to form a second circuit layer.

3. The circuit board of claim 1, wherein the multiple through holes defines slots; the antenna conductors are disposed in the slots.

4. The circuit board of claim 1, wherein a material of the antenna conductor is copper.

* * * * *